United States Patent [19]

Sakamoto et al.

[11] Patent Number: 4,654,506

[45] Date of Patent: Mar. 31, 1987

[54] METHOD AND APPARATUS FOR DETECTING AND REGULATING POSITION OF WELDING ELECTRON BEAM

[75] Inventors: Masahiko Sakamoto; Yoshio Yamane; Seigo Hiramoto, all of Hyogo, Japan

[73] Assignee: Mitsubishi Denki Kabushiki Kaisha, Tokyo, Japan

[21] Appl. No.: 703,565

[22] Filed: Feb. 20, 1985

[30] Foreign Application Priority Data

Feb. 20, 1984 [JP] Japan .................................. 59-28779
Apr. 27, 1984 [JP] Japan .................................. 59-85532

[51] Int. Cl.$^4$ ............................................. B23K 9/00
[52] U.S. Cl. ........................ 219/121 ES; 219/121 EW; 219/121 ET; 250/397
[58] Field of Search ................. 219/121 EB, 121 EM, 219/121 ES, 121 EW, 121 EC, 121 ET; 250/491.3, 492.2, 397, 353

[56] References Cited

U.S. PATENT DOCUMENTS

| | | | |
|---|---|---|---|
| 3,146,335 | 8/1964 | Samuelson | 219/121 ES |
| 3,426,174 | 2/1969 | Graham et al. | 219/121 EB |
| 3,691,341 | 9/1972 | Roiron et al. | 219/121 ES |
| 3,752,952 | 8/1973 | Ruge et al. | 219/121 EM |
| 3,894,271 | 7/1975 | Pfeiffer et al. | 219/121 EW |
| 4,012,620 | 3/1977 | Sciaky | 219/121 EM |
| 4,348,576 | 9/1982 | Anderl et al. | 219/121 EW |
| 4,357,517 | 11/1982 | de Sivry et al. | 219/121 ES |
| 4,423,305 | 12/1983 | Pfeiffer | 219/121 EW |
| 4,433,243 | 2/1984 | Nakamura et al. | 219/121 EY |
| 4,546,260 | 10/1985 | Simpson | 219/121 EW |

FOREIGN PATENT DOCUMENTS

| | | |
|---|---|---|
| 1941255 | 2/1970 | Fed. Rep. of Germany . |
| 3033523 | 3/1982 | Fed. Rep. of Germany . |
| 2087114 | 12/1971 | France .......................... 219/121 EB |

Primary Examiner—M. H. Paschall
Attorney, Agent, or Firm—Sughrue, Mion, Zinn, Macpeak and Seas

[57] ABSTRACT

A method and apparatus for detecting and regulating a focused condition of an electron beam emitted from an electron gun of an electron beam welding apparatus. An electron beam of a low intensity is first directed onto the workpiece. The coil current of an electromagnetic condenser lens used to focus the electron beam is then varied linearly. The resulting electrons and other radiation produced from the workpiece as a result of this irradiation is then sensed and a signal corresponding to the intensity thereof is produced. The focus position of the electron beam is determined in accordance with variations in this signal.

12 Claims, 19 Drawing Figures

METHOD AND APPARATUS FOR DETECTING AND REGULATING POSITION OF WELDING ELECTRON BEAM

BACKGROUND OF THE INVENTION

The present invention relates to a method and apparatus for detecting and regulating a focused condition of an electron beam emitted from an electron gun of an electron beam welding apparatus and directed onto a workpiece, and, more particularly, to a method and apparatus for detecting and regulating a focus point on the workpiece prior to commencing a welding operation.

It has been usual that the focusing of an electron beam is detected and regulated by directing an electron beam onto a dummy block of a material such as tungsten or copper and regulating the current flowing through an electromagnetic lens coil while observing the spot of the electron beam or a melt pond on the surface of the workpiece or the dummy block. Such a conventional method is disadvantageous in that the detection and regulation of the electron beam depend upon the operator's eyes.

Particularly, in an actual welding operation, the focus position of the electron beam on the workpiece affects the profile of the weld portion. FIGS. 1A through 3A illustrate the focus position of electron beams and FIGS. 1B through 3B corresponding profiles of weld portions.

In FIGS. 1A and 1B, when the electron beam EB is focused exactly on the surface of the worpiece WK, the welding is made to a certain depth with a small diameter. On the other hand, when the focus point is inside the workpiece WK, as shown in FIGS. 2A and 2B, the welding depth becomes much smaller than in the case shown in FIGS. 1A and 1B, but with a larger diameter. If the focus point is above the workpiece surface, as shown in FIGS. 3A and 3B, the weld profile becomes similar to a shape of a short and thick nail. The weld profiles shown in FIGS. 2B and 3B are not acceptable.

In order to resolve this problem, Japanese Laid-Open Patent Application No. 48-339 proposes a technique according to which light produced by an electron beam and reflected from the portion of a surface of a workpiece onto which the electron beam is directed is sensed by an indicator and focusing regulation is performed accordingly. This technique is more effective than visual observance of the melt pond. However, the energy of the electron beam used for regulation is much smaller than that of the electron beam used to weld the workpiece, and thus it is necessary to increase the electron beam energy after regulation has been completed. Moreover, possible variation of the focusing position due to an increase of the electron beam energy is not taken into account. Further, although the precision of the focusing position regulation may be higher than that obtainable by visual observance, the technique is still disadvantageous since the precision depends on the skill of the operator. Eggers et al. propose in their article "Automatic Focusing in High Power Electron Beam Welding", IIW-Doc. No. IV/57/71, April 1971, a technique in which electrons emitted from a workpiece irradiated with an electron beam is utilized to detect the focus position while the focus position is changed. A pair of electron collectors are used to detect the focus position. Since this technique uses the welding beam directly, it is necessary to use complicated electronics circuits in order to avoid undesirable welding conditions.

SUMMARY OF THE INVENTION

An object of the present invention is to provide a method and apparatus for detecting and regulating a focusing position of an electron beam on a workpiece precisely without the accuracy being affected by the skill of the operator.

Another object of the prevent invention is to provide a method and apparatus for automatically detecting and regulating the focusing position of an electron beam precisely within a short period of time.

These and other objects are achieved, according to the present invention, by moving a focusing position of a pilot electron beam by changing an electric current flowing through an electromagnetic condenser lens while irradiating a workpiece with the pilot electron beam, detecting either electrons or other radiation emitted from the workpiece due to the pilot electron beam irradiation thereof, and detecting the focusing position of the pilot beam on the basis of the detected electrons or other radiation. According to this method, compensation for variation of the focusing position due to a difference in energy between the pilot electron beam and the actual electron beam is performed by using predetermined correction data. According to another aspect of the present invention, the electrons or other radiation produced from the workpiece are detected by a collector composed of a plurality of segments each maintained at a different potential, and signals from the segments are used to focus the electron beam on the workpiece surface such that the diameter of the electron beam spot on the workpiece surface is minimized.

BRIEF DESCRIPTION OF THE DRAWINGS

FIGS. 1A to 3B illustrate relations between focusing positions of an electron beam on a workpiece and pond profiles of a portion of the workpiece welded by the electron beam;

DESCRIPTION OF THE PREFERRED EMBODIMENTS

Figures 1A, 2A, 3A:
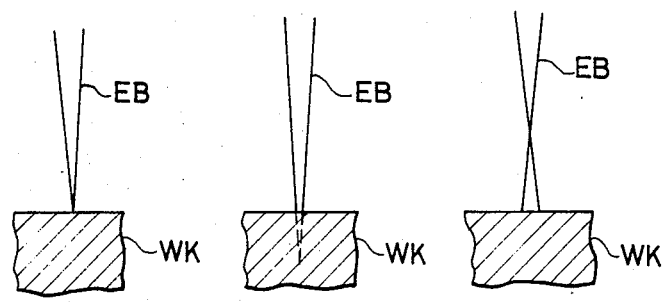
Figures 1B, 2B, 3B:
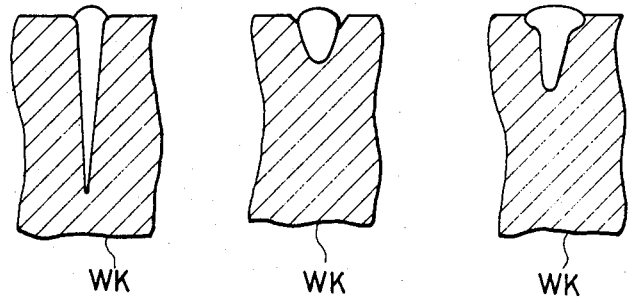
Figure 4:
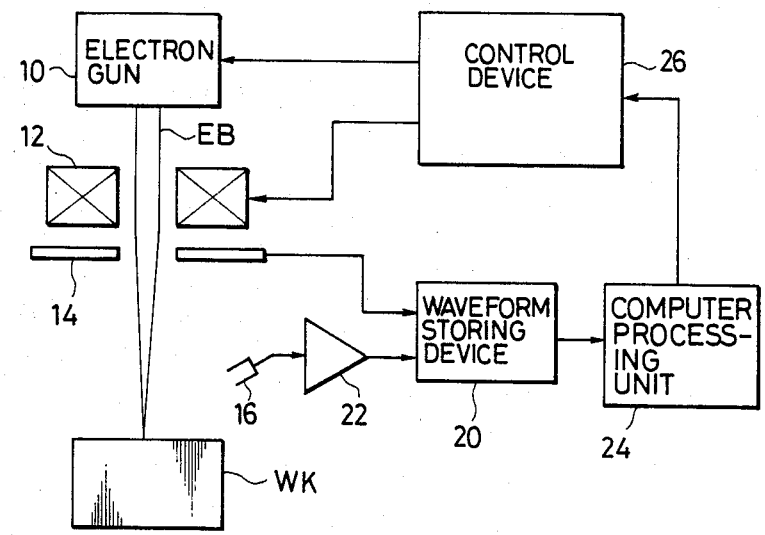
FIG. 4 is a block diagram showing an embodiment of a device for practicing the present invention.
Figure 5:
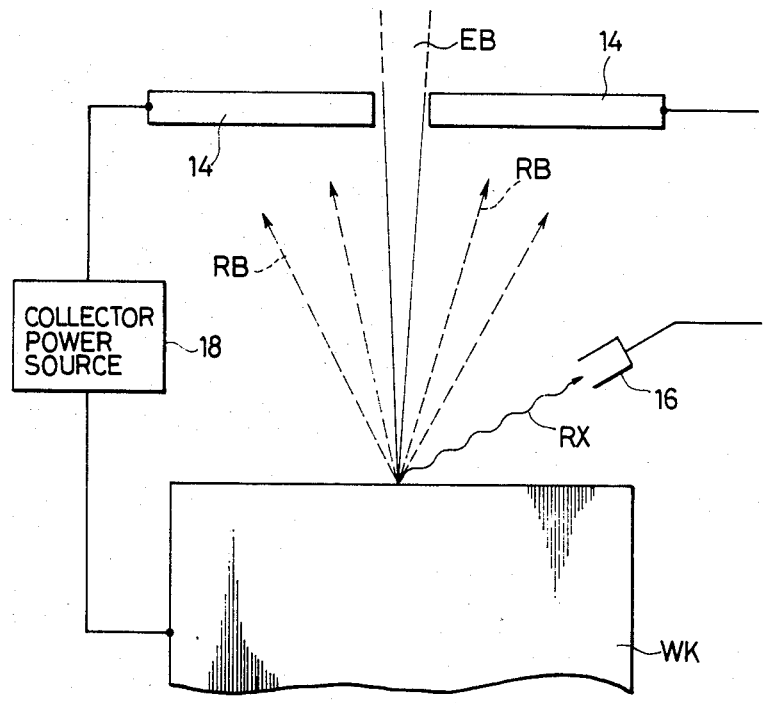
FIG. 5 illustrates the generation of secondary electrons and X-rays on the workpiece surface as a result of irradiation thereof with the electron beam.
Figure 6:
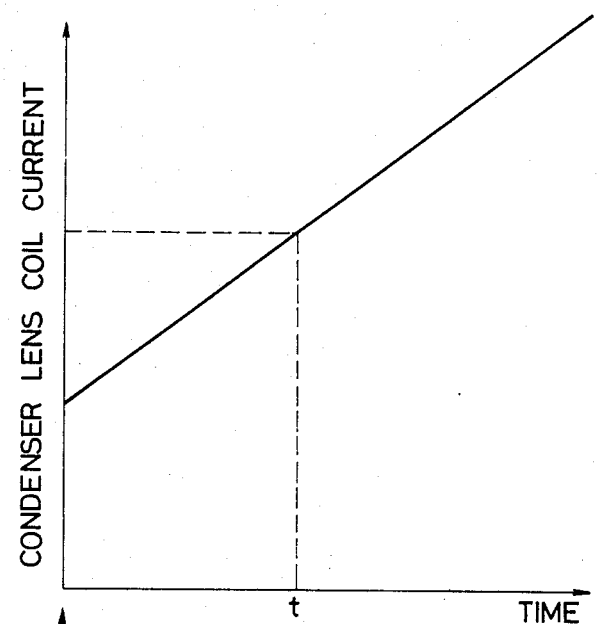
FIG. 6 shows an example of coil current variation of an electromagnetic condenser lens due to focusing position regulation.

In FIGS. 4 and 5, a pilot electron beam EB emitted from an electron gun 10 is directed to a workpiece WK. In the path of the electron beam EB, an electromagnetic condenser lens and an electron collector 14 are provided. The condenser lens 12 is composed of a coil with which the degree of condensing of the electron beam is regulated by controlling a current flowing through the coil. In this embodiment, the current in the lens coil is varied with time as shown in FIG. 6. The current variation is set such that the electron beam EB is focused on the workpiece WK in a working chamber (not shown) regardless of the position thereof in the chamber. The focusing position regulation is performed with an electron beam having an energy smaller than that necessary to do work, namely, to perform an actual welding operation.

An electron collector 14 detects the reflected electron beam, and an X-ray sensor 16 is disposed in the vicinity of the focus point of the electron beam EB on the workpiece WK to detect X-rays emitted therefrom. Either of the electron collector 14 or X-ray sensor 16 may be omitted if desired.

A collector power source 18 is connected between the electron collector 14 and the workpiece WK. The collector power source 18 is adapted to apply a potential to the electron collector 14 which is positive or negative with respect to the potential of the workpiece WK. When the workpiece WK is irradiated with the electron beam EB, a radiation electron beam (RB) and X-rays (RX) are produced therefrom. The radiation electron beam RB includes reflected electrons, secondary electrons and thermal electrons. The energies of these electrons are related as follows:

reflected electron energy > secondary electron energy reflected electron energy > thermal electron energy Therefore, if a negative potential is applied to the electron collector 14 by the collector power source 18, only the reflected electrons reach the electron collector 14, while if the potential of the electron collector 14 is positive, secondary electrons and thermal electrons reach the electron collector 14 in addition to the reflected electrons. The collector 14 and/or X-ray sensor 16 provide electric signals indicative of the presence of the radiation electron beam RB and the X-ray beam RX thereat. These signals vary with the amount of displacement of the focusing point of the electron beam EB.

The electron collector 14 is connected to a waveform storing device 20 and the X-ray sensor 16 is connected through an amplifier 22 to the waveform storing device 20, which temporarily stores the waveforms of the signals supplied thereto. The amplifier 22 is used to amplify the output signal of the X-ray sensor 16.

The output of the waveform storing device 20 is connected to a computer processing unit 24, which analyzes the signal waveforms stored in the waveform storing device and provides a control signal according to correction data (described below) and a result of analysis.

The computer processing unit 24 is connected to a control device 26, which in turn is connected to the electron gun 10 and the condenser lens 12. The electron gun 10 and the condenser lens 12 are controlled by control signals derived from the computer processing unit 24 under the control of the control device 26.

In operation, when the focus position is being detected and regulated by the radiation electron beam RB, the electron collector 14 is used as a detector. The electron beam EB, at a reduced energy, is directed to the workpiece WK. Then, the current flowing through the condensing lens 12 is increased linearly as shown in FIG. 6.

Figure 7:
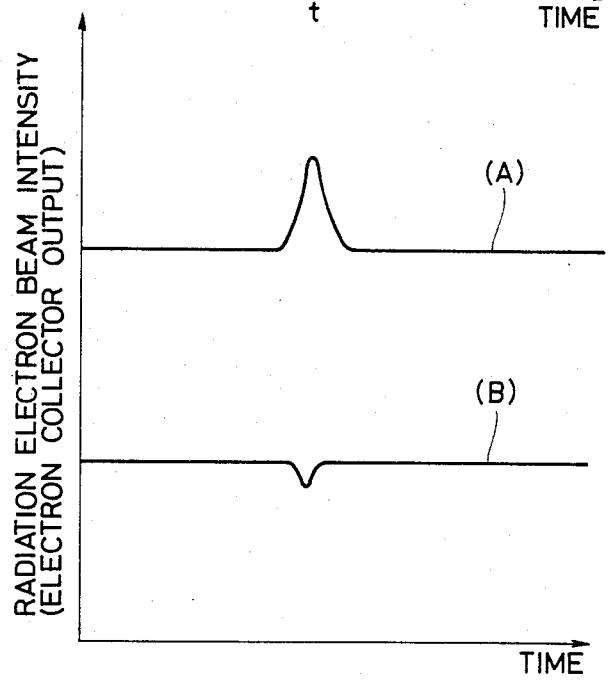
FIG. 7 shows an example of variation of the secondary electron beam intensity.

A curve A in FIG. 7 shows the intensity of the radiation electron beam RB, i.e., the magnitude of the output of the electron collector 14, when the current in the condenser lens 12 is increased as shown in FIG. 6, with the potential of the collector 14 being positive with respect to the workpiece WK, and a curve B shows the same with the potential being negative.

As discussed above, all of the reflected electrons, secondary electrons and thermal electrons are received by the electron collector 14 when the potential thereof is positive. In this case, when the beam RB is focused on the surface of the workpiece WK, if the condenser lens coil current is increased linearly, the temperature of the latter will increase, and therefore the rate of thermal electron production increases. Thus, the radiation electron beam intensity is increased locally, as shown by the curve A in FIG. 7. The value i of the condenser lens current at the time t at which the peak intensity is obtained corresponds to the focused position, as shown in FIG. 6.

When the potential of the electron collector 14 is negative, only reflected electrons reach the electron collector 14. In this case, the diameter of the electron beam spot on the surface of the workpiece WK decreases with an increase of the condenser lens coil current, becoming a minimum at the time t, after which it decreases with a further increase of the current. That is, the electron beam is focused on the workpiece surface at which the beam density becomes high enough to melt and evaporate the focused portion of the surface, thus lowering the actual surface level of that portion which causes the radiation electron intensity to be reduced locally, as shown by the curve B in FIG. 7. The current i flowing through the condenser lens 12 at the time t of the local reduction of the radiation electron beam strength in FIG. 6 corresponds to the focus position.

The output waveforms of the electron collector 14 shown by the curves A and B in FIG. 7 are stored temporarily in the waveform storing device 20.

Figure 8:
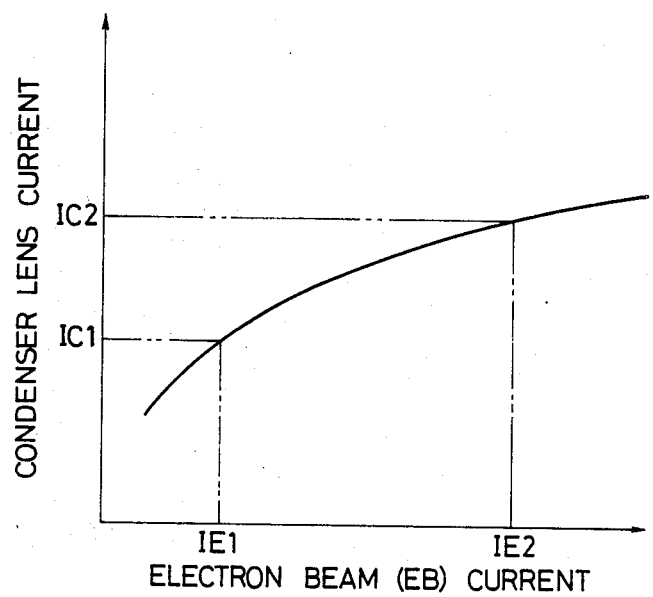
FIG. 8 shows an example of the relation between the electron beam current and the coil current of a condenser lens.
Figure 9:
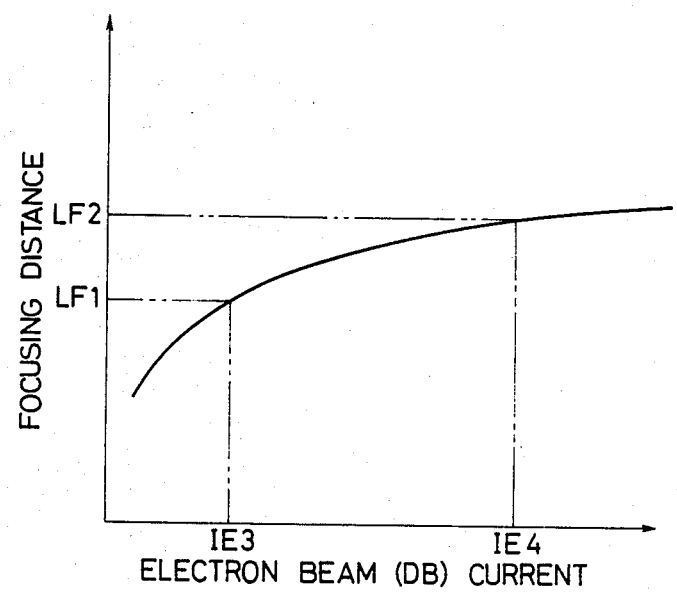
FIG. 9 shows an example of the relation between the electron beam current and focal length.

The computer processing unit 24 stores correction curves, one of which is shown in FIG. 8, one of which is shown in FIG. 9, and provides a control signal in accordance with data obtained from these correction curves, which is sent to the control device 26.

In a case where control is performed on the basis of the correction data obtained from FIG. 8, which is a curve from among a set of curves each indicating the coil current of the condenser lens 12 for a fixed focus position while the electron beam current is varied, the data includes a plurality of correction curves each for various distances (work distances) between the condenser lens 12 and the workpiece WK.

In the computer processing unit 24, the time t at which the waveforms stored in the waveform storing unit 20 show a local value (FIG. 7) is obtained, and then the current of the condenser lens coil corresponding to the time t is obtained from FIG. 6. Thereafter, one of the correction curves corresponding to a specific work distance is selected in the processing unit 24. For example, when the current of the condenser lens coil obtained in the processing unit 24 is IC1 and the electron beam current is IE1, the correction curve to be selected is as shown in FIG. 8. That is, the correction curve corresponding to a specific selected work distance is one which passes through a point of intersection of the current of the condenser lens coil and the electron beam current IE1.

Using the correction curve selected as above, the current IC2 of the condenser lens 12 corresponding to the work current IE2 of the electron beam EB can be obtained as shown in FIG. 8. According to these data values, a control signal is produced and sent to the control device 26 which controls the electron gun 10 and the condenser lens 12 so that the electron beam current is set at IE2 and the current of the condenser lens 12 is again regulated to IC2.

When control is to be performed on the basis of the correction data obtained from FIG. 9, which is a curve among a set of curves indicating the relation of the focal distance to the electron beam current, the computer processing unit 24 determines the current of the coil of the condenser lens 12 when the focus is regulated in the same manner as mentioned before. Then, the correction curve shown in FIG. 9 is selected corresponding to the current value of the coil of the condenser lens 12. In this regard, if the electron beam current during the focus regulation operation is IE3, the position of the workpiece WK, and hence the focal distance during the focus regulation operation, is LF1. From this, the focal distance LF2 corresponding to the electron beam work current IE4 during machining operations can be obtained. The control signal is prepared in response to these data values, i.e., LF1, LF2, IE4, and sent to the control device 26. The control device 26, in response to the control signal, controls the electron gun 10 and a table (not shown) on which the workpiece WK is mounted. That is, the control device 26 controls the electron gun 10 such that the electron beam current becomes IE4 and the table such that the focal distance is changed from LF1 to LF2.

As is clear from the foregoing, when the correction data is obtained from the correction curves in FIG. 8, the current of the coil of the condenser lens 12 is regulated while the position of the workpiece WK is unchanged. On the contrary, when the correction data is obtained from the correction curves in FIG. 9, the position of the workpiece WK is regulated while the current of the coil of the condenser lens 12 is unchanged.

Figure 10:
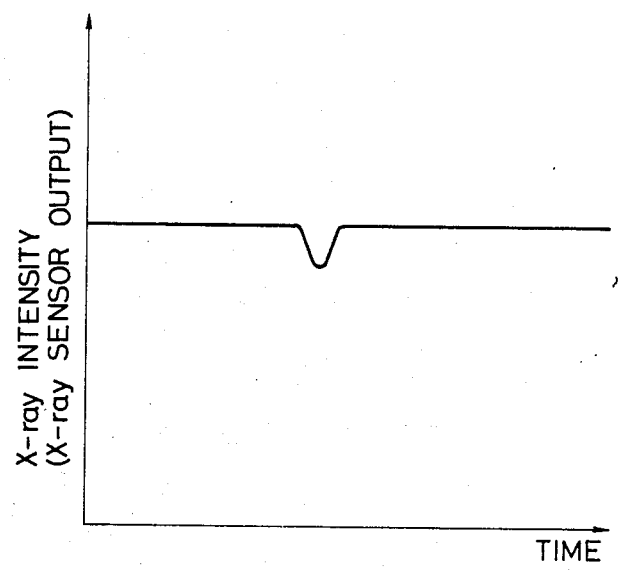
FIG. 10 shows an example of variation of the X-ray intensity.

In a case where the detection and regulation of the focus position is performed with X-rays (RX), the X-ray sensor 16 is used. In this case, the workpiece WK is irradiated with an electron beam as in the previous case. Then, the current of the coil of the condenser lens 12 is changed as shown in FIG. 6. The resulting variation of the X-ray intensity, i.e., the output of the X-ray sensor 16, is shown in FIG. 10, which corresponds to the curve B in FIG. 7 when the electron collector 14 is at a negative potential. That is, when the electron beam EB is focused on the surface of the workpiece WK, the electron beam density is increased and a minute portion thereof is melted and evaporated, causing the actual surface level of that portion of the workpiece WK to be lowered. Thus, the intensity of X-rays therefrom is locally decreased.

The signal shown in FIG. 10 is amplified by the amplifier 22 and stored in the waveform storage device 20. Subsequent operations are the same as those described with respect to the previous embodiments.

In some of the above-described embodiments, focus regulation is performed by irradiating the workpiece directly with an electron beam. However, it is also possible to use a suitable member positioned on the workpiece and irradiate it with an electron beam. The latter case may be beneficial when small defects on the workpiece surface should be avoided.

According to the present invention, it is possible to detect the focus position exactly and to regulate it with high precision, independent of the skill of the operator. Further, since the variation of the focus position resulting from the difference in beam current between the focus detection period and the actual working period is corrected on the basis of the preliminarily obtained correction data, the time period required to regulate the focus position is shortened, and it is possible to perform focus position regulation automatically.

Figure 11:
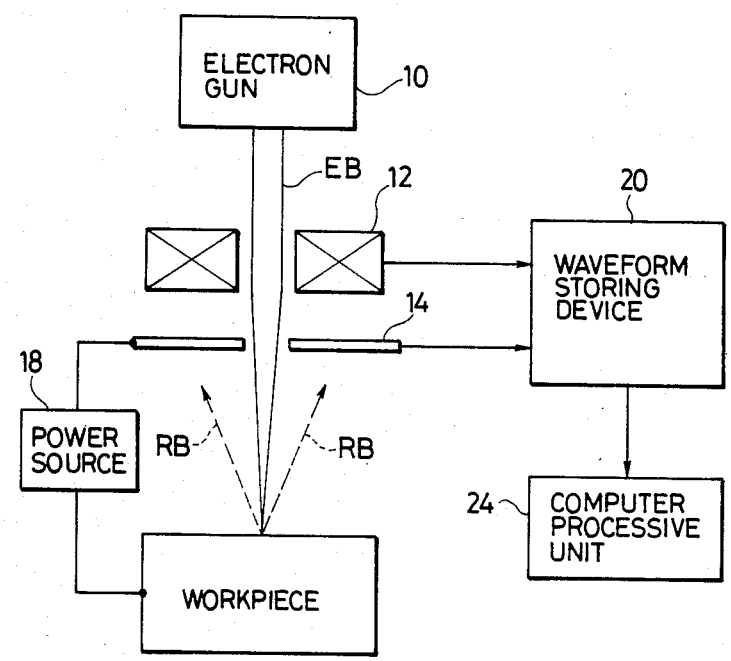
FIG. 11 shows another example of variation of the X-ray intensity.
Figure 12:
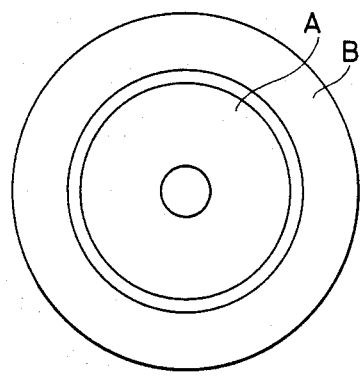
FIG. 12 illustrates an electron collector.

FIG. 11 shows another embodiment of the present invention, which differs from the embodiment of FIG. 4 in that the current waveform of the condenser lens 12 and the output waveform of the electron collector 14 are stored temporarily in the waveform storing device 20, in that there is no control device 26, and in that the electron collector 14 is constituted with a pair of coaxially arranged members A and B, as shown in FIG. 12. A power source 18 connected between the coaxial members A and B and the workpiece WK provides a potential difference therebetween.

Figure 13:
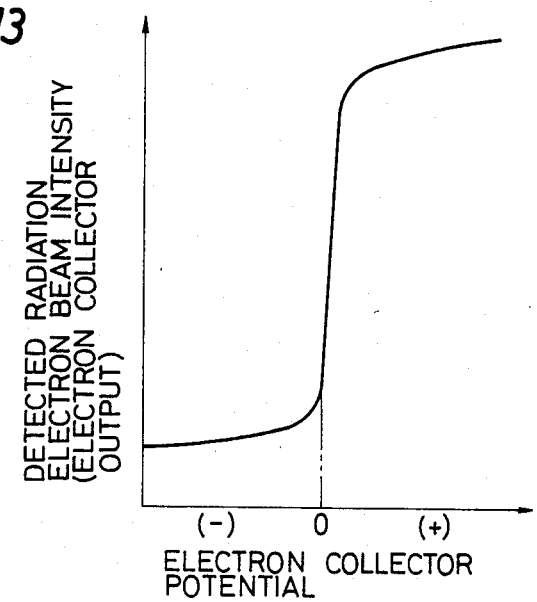
FIG. 13 is a graph showing a relation of the electron collector potential and the detected radiation of an electron beam from the workpiece.

FIG. 13 shows the relation between the potential of the electron collector 14 and the intensity of the electron beam RB detected thereby, in which the electron intensity is abruptly changed at around the zero point of the potential. The latter change depends upon the energy distribution of the three electron beams, as shown in FIG. 14.

Figure 14:
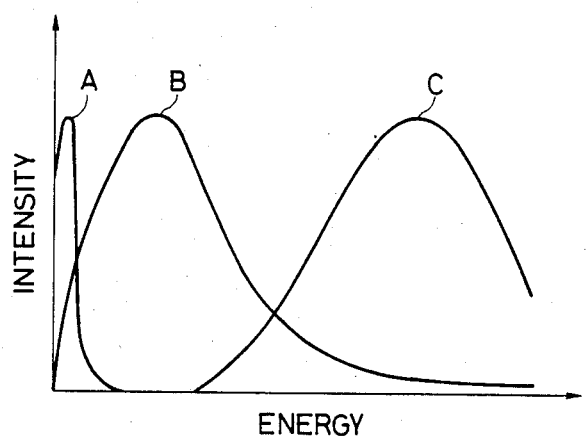
FIG. 14 is a graph showing energy distributions of various electrons emitted from the workpiece.

In FIG. 14, the energy distributions A, B and C correspond to thermal electrons, secondary electrons and reflected electrons, respectively. As can be readily understood therefrom, only the reflected high energy electrons of the radiated electron beam RB reach one of the members of the collector 14 to which a negative potential is applied. The other member, to which a positive potential is applied, receives secondary electrons and thermal electrons, which are of low energy. The electron collector 14 provides an electric signal corresponding thereto. Therefore, the output signal from the electron collector 14 varies with the focussing condition of the electron beam EB.

In operation, the electron beam EB is directed to the workpiece WK, and then the current of the coil of the condenser lens 12 is increased, as shown in FIG. 6. In this case, the spot diameter of the electron beam EB on the workpiece WK decreases with time to a minimum value at which the beam EB is focussed on the surface and then increases. At the time at which the spot diameter of the beam EB becomes minimum, the portion of the workpiece surface on which the beam falls is melted and evaporated and the output of the electron collector 14 becomes as shown in FIG. 7, as mentioned previously.

When the current value of the electron beam EB for the focussing detection is small, the amount of the workpiece portion which is melted and evaporated thereby is small. Also, the variation of the signal produced by the reflected electron beam is small, and thus it becomes difficult to detect focussing by means of the peak value of the curve B in FIG. 7. Moreover, if the beam caused by the thermal electrons is broadened, it is difficult to detect focussing exactly.

Figure 15:
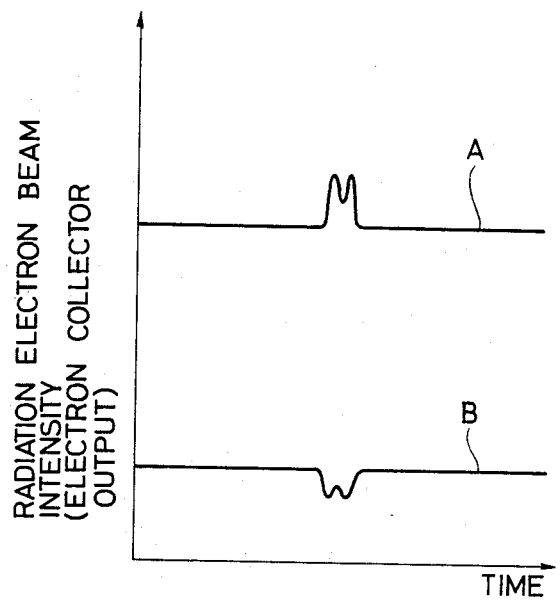
FIG. 15 is a graph similar to that of FIG. 7, showing another example of a local peak configuration.

According to this embodiment, the output signals from the members of the electron collector 14 are stored in the waveform storage device 20 together with the current curve of the coil of the condenser lens 12. The computer processing unit 24 processes this stored data to determine the condenser lens coil current value at which the electron beam EB is focussed on the workpiece WK. This arrangement is also effective when the peaks are not simple in waveform as shown in FIG. 7 but relatively complex such as shown in FIG. 15.

Figure 16:
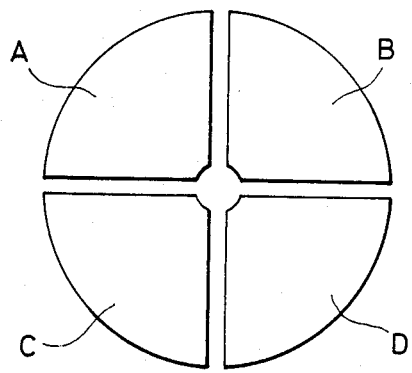
FIG. 16 shows another embodiment of an electron collector.

The electron collector 14 is shown in FIG. 12 as being constituted with two coaxially arranged members A and B. As an alternative, the members of the coaxial members may be three or more with different potentials being applied thereto. Alternatively, the electron collector 14 may take the form of a plurality of sectors, as shown FIG. 16. With this electron collector, various kinds of electrons emitted from the workpiece can be collected separately.

The current of the coil of the condenser lens 12 may be reduced differently from that shown in FIG. 6, so long as it is done linearly.

We claim:

1. A detecting and regulating method for focus position control of an electron beam emitted from an electron gun and condensed by an electromagnetic condenser lens of an electron beam machining apparatus, comprising the steps of:
   irradiating a workpiece with an electron beam from said electron gun at a first intensity;
   linearly changing a current flowing through a coil of said electromagnetic condenser lens to move the focus position of said electron beam with respect to the workpiece;
   detecting at least one of first and second types of radiation produced from said workpiece as a result of said irradiation to provide a signal varying in a manner corresponding to the intensity of said radiation;
   determining the focus position of said electron beam according to variations of said signal;
   determining a value of current flowing through said coil when said focus position is at a surface level of said workpiece;
   correcting said focus position on the basis of said current value and preliminarily prepared correction data without altering said correction data; and
   setting a focus position of said electron beam at a second intensity higher than said first intensity.

2. The method of claim 1, wherein said correction data is indicative of currents of said coil with which the focus position of the electron beam is maintained constant at an arbitrary work point regardless of a variation of a distance between said workpiece and said electron gun, and wherein the setting step is performed by controlling said current of a said coil.

3. The method of claim 1, wherein said correction data is indicative of a relation between an electron beam current and focus position at an arbitrary condenser lens coil current, and wherein the setting step is performed by regulating the position of said workpiece.

4. The method of claim 1, wherein said first type of radiation includes at least one of secondary electrons, reflected electrons and thermal electrons.

5. The method of claim 1, wherein said second type of radiation comprises X-rays.

6. An apparatus for detecting focussing of an electron beam emitted from an electron beam machining apparatus having an electron gun and an electromagnetic condenser lens comprising: an electron collector disposed between said condenser lens and a workpiece for collecting at least one of first and second types of radiation produced upon irradiation of said workpiece with an electron beam of a first energy, said collector providing an electric signal indicative of an intensity of said at least one of said first and second types of radiation; means for linearly changing a current flowing through a coil of said condenser lens to move the focus point of said electron beam in one direction with respect to said workpiece; and means for detecting a local peak of said electric signal to determine the focus position of the electron beam along said one direction; means for detecting a value of said current at a time when said local peak is detected; means for storing preliminarily prepared correction data; and means responsive to said current value and said correction data for correcting the focus position without altering said correction data so as to obtain a correct focus position of an electron beam of a second energy higher than said first energy.

7. The apparatus of claim 6, wherein said correction data is indicative of a relation between an electron beam current and said current at which the focus position is maintained constant at any work distance between said electron gun and said workpiece.

8. The apparatus of claim 6, wherein said correction data is indicative of a relation between an energy of said electron beam and the focus distance at respective values of said current through said coil.

9. The apparatus of claim 6, wherein said electron collector comprises: coaxially arranged inner and outer collector plates having different potentials, said inner collection plate having a center hole through which said electron beam from said electron gun passes.

10. The apparatus of claim 6, wherein said electron collector comprises: a disk-shaped plate having a center hole through which said electron beam from said electron gun passes, said disk-shaped plate being at a predetermined potential.

11. The apparatus of claim 9, wherein said disk plate comprises: coaxially arranged inner and outer plates, said coaxial plates being at different potentials, whereby at least secondary electrons, radiated electrons, and thermal electrons from said workpiece are detected separately thereby.

12. The apparatus of claim 9, wherein said disk plate comprises: A plurality of sectors each being at a different potential, wehreby at least secondary electrons, radiated electrons, and thermal from said workpiece are detected separately.

* * * * *